United States Patent
Betz et al.

(10) Patent No.: US 8,935,650 B2
(45) Date of Patent: *Jan. 13, 2015

(54) METHOD AND APPARATUS FOR PERFORMING PARALLEL ROUTING USING A MULTI-THREADED ROUTING PROCEDURE

(71) Applicant: Altera Corporation, San Jose, CA (US)

(72) Inventors: Vaughn Betz, Toronto (CA); Jordan Swartz, Toronto (CA); Vadim Gouterman, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/245,162

(22) Filed: Apr. 4, 2014

(65) Prior Publication Data

US 2014/0223403 A1 Aug. 7, 2014

Related U.S. Application Data

(63) Continuation of application No. 13/957,794, filed on Aug. 2, 2013, now Pat. No. 8,739,105, which is a continuation of application No. 13/615,563, filed on Sep. 13, 2012, now Pat. No. 8,533,652, which is a continuation of application No. 13/311,996, filed on Dec. 6, 2011, now Pat. No. 8,296,709, and a continuation of application No. 12/317,789, filed on Dec. 29, 2008, now Pat. No. 8,095,906.

(51) Int. Cl.
G06F 17/50 (2006.01)

(52) U.S. Cl.
CPC ................ *G06F 17/5077* (2013.01)

USPC .......... 716/131; 716/110; 716/125; 716/126; 716/129; 716/130

(58) Field of Classification Search
USPC .................. 716/110, 125, 126, 129, 130, 131
See application file for complete search history.

(56) References Cited

U.S. PATENT DOCUMENTS

| | | | |
|---|---|---|---|
| 5,781,439 | A | 7/1998 | Rostoker et al. |
| 5,838,585 | A | 11/1998 | Scepanovic et al. |
| 5,875,117 | A | 2/1999 | Jones et al. |
| 5,903,461 | A | 5/1999 | Rostoker et al. |
| 6,012,061 | A | 1/2000 | Sharma |
| 6,154,874 | A | 11/2000 | Scepanovic et al. |
| 6,175,950 | B1 | 1/2001 | Scepanovic et al. |
| 6,230,306 | B1 | 5/2001 | Raspopovic et al. |
| 6,253,363 | B1 | 6/2001 | Gasanov et al. |
| 6,324,674 | B2 | 11/2001 | Andreev et al. |
| 6,557,145 | B2 | 4/2003 | Boyle et al. |
| 7,036,101 | B2 | 4/2006 | He et al. |
| 8,095,906 | B2 | 1/2012 | Betz et al. |
| 8,234,614 | B1 | 7/2012 | Wen et al. |
| 8,296,709 | B2 | 10/2012 | Betz et al. |

(Continued)

OTHER PUBLICATIONS

U.S. Appl. No. 13/957,794, filed Aug. 2, 2013, In Re Application of Vaughn Betz, et al.

*Primary Examiner* — Sun Lin
(74) *Attorney, Agent, or Firm* — L. Cho

(57) ABSTRACT

A method for designing a system to be implemented on a target device includes generating bounding boxes on the target device for nets in the system where a bounding box identifies routing resources available for routing its corresponding net. The nets in the system are assigned to a plurality of threads to be routed. The threads are executed so that a plurality of the nets are routed in parallel within their corresponding bounding box.

20 Claims, 13 Drawing Sheets

(56) References Cited

U.S. PATENT DOCUMENTS

| | | |
|---|---|---|
| 8,533,652 B2 | 9/2013 | Betz et al. |
| 2006/0190897 A1 | 8/2006 | He et al. |
| 2009/0031269 A1 | 1/2009 | Chen et al. |
| 2009/0172623 A1 | 7/2009 | Cross et al. |
| 2010/0146209 A1 | 6/2010 | Burger et al. |
| 2011/0055780 A1 | 3/2011 | Venell |
| 2011/0055784 A1 | 3/2011 | Gao et al. |
| 2011/0055789 A1 | 3/2011 | Chakanaker et al. |

METHOD AND APPARATUS FOR PERFORMING PARALLEL ROUTING USING A MULTI-THREADED ROUTING PROCEDURE

RELATED APPLICATIONS

This application is a continuation of and claims priority and benefit to U.S. Pat. No. 8,739,105 filed on Aug. 2, 2013, entitled, "Method and Apparatus for Performing Parallel Routing Using a Multi-Threaded Routing Procedure", which is a continuation of and claims priority and benefit to U.S. Pat. No. 8,533,652 filed on Sep. 13, 2012, entitled, "Method and Apparatus for Performing Parallel Routing Using a Multi-Threaded Routing Procedure", which is a continuation of and claims priority and benefit to U.S. Pat. No. 8,296,709 filed on Dec. 6, 2011, entitled, "Method and Apparatus for Performing Parallel Routing Using a Multi-Threaded Routing Procedure", which is a continuation of and claims priority and benefit to U.S. Pat. No. 8,095,906 filed on Dec. 29, 2008, entitled, "Method and Apparatus for Performing Parallel Routing Using a Multi-Threaded Routing Procedure".

TECHNICAL FIELD

Embodiments of the present invention relate to tools such as electronic design automation (EDA) tools for designing systems on target devices such as field programmable gate arrays (FPGAs) and application specific integrated circuits (ASICs). More specifically, embodiments of the present invention relate to a method and apparatus for performing parallel routing using a multi-threaded routing procedure.

BACKGROUND

Logic devices such as FPGAs and ASICs are used to implement large systems that may include million of gates and megabits of embedded memory. The complexity of large systems often requires the use of EDA tools to create and optimize a design for the system onto physical target devices. Among the procedures performed by EDA tools in a computer aided design (CAD) flow are synthesis, placement, and routing. Even with the assistance of EDA tools, the routing phase often takes hours and sometimes days to complete for large designs.

In the past, new processors in computer systems increased clock speeds and reduced the number of cycles required per instruction. This allowed the routing run times for EDA tools to be maintained relatively constant over the years despite the increase in the sizes of the target devices. However, new generations of processors being released today are not using clocks that are significantly faster than previous models. Instead, the new generation processors include more than one processor core inside to allow computers to simultaneously run several "threads" of execution in parallel.

Although a limited number of parallel routing algorithms exist to take advantage of these new generation processors, these parallel routing algorithms typically require significant overhead for broadcasting large amounts of data between threads to support synchronization of data. In addition, prior parallel ASIC global routing and parallel FPGA routing algorithms are not deterministic in that they do not reproduce identical routing results despite being run with exactly the same inputs. This is very problematic for testing.

SUMMARY

According to an embodiment of the present invention, a multi-threaded routing procedure allows a plurality of nets to be routed in parallel. A bounding box is generated for nets to be routed in the system. The bounding box is constructed around all the terminals of the net. The bounding box limits the scope of the search in a routing resource graph during routing. Resources outside of the bounding box are not allowed to be used by a router to route the net. Nets having bounding boxes that do not intersect are allowed to be routed in parallel since they will not explore the same portions of the routing resource graph. Based upon these principles a routing schedule may be derived for available threads.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
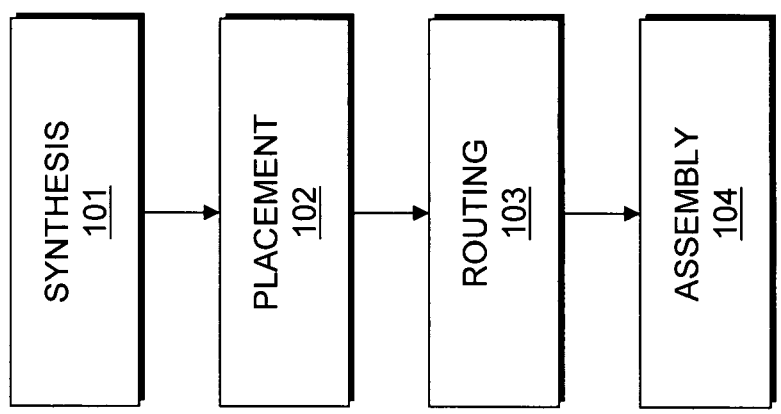
FIG. 1 is a flow chart illustrating a method for designing a system on a target device according to an exemplary embodiment of the present invention.

FIG. 1 is a flow chart illustrating a method for designing a system on a target device according to an embodiment of the present invention. The procedure shown in FIG. 1 may be performed by an EDA tool such as a system designer implemented on a computer system. The computer system may include a plurality of processors or processor cores capable of being utilized to execute a plurality of threads that may perform various tasks in parallel.

At 101, synthesis is performed on a design of a system. According to an embodiment of the present invention, synthesis generates an optimized logical representation of the system from a HDL design definition. The optimized logical representation of the system may include a representation that has a minimized number of functional blocks such as logic gates, logic elements, and registers required for the system. Technology mapping is also performed on the optimized logic design. Technology mapping includes determining how to implement logic gates and logic elements in the optimized logic representation with resources available on the target device. The resources available on the target device may be referred to as "cells" or "components" and may include logic-array blocks, registers, memories, digital signal processing blocks, input output elements, and other components. According to an embodiment of the present invention, an optimized technology-mapped netlist (cell netlist) is generated from the HDL.

At 102, the mapped logical system design is placed. Placement works on the optimized technology-mapped netlist to produce a placement for each of the functional blocks. According to an embodiment of the present invention, placement includes fitting the system on the target device by determining which resources available on the target device are to be used for specific function blocks in the optimized technology-mapped netlist. According to an embodiment of the present invention, placement may include clustering which involves grouping logic elements together to form logic clusters or functional blocks such as logic array blocks present on the target device.

At 103, it is determined which routing resources should be used to connect the components in the target device implementing the functional blocks of the system. During routing, routing resources on the target device are allocated to provide interconnections between logic gates, logic elements, and other components on the target device. The routing procedure may be performed by a router in an EDA tool that utilizes routing algorithms. According to an embodiment of the present invention, a net that includes a source and one or more sinks may be routed in parallel with another net on the target device. In this embodiment, the nets to be routed may be allocated to a plurality of available threads to be routed in parallel based upon their positions on the target device and/or their positions relative to each other.

At 104, an assembly procedure is performed. The assembly procedure involves creating a data file that includes some of the information determined by the procedure described by 101-103. The data file may be a bit stream that may be used to program the target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

Figure 2:
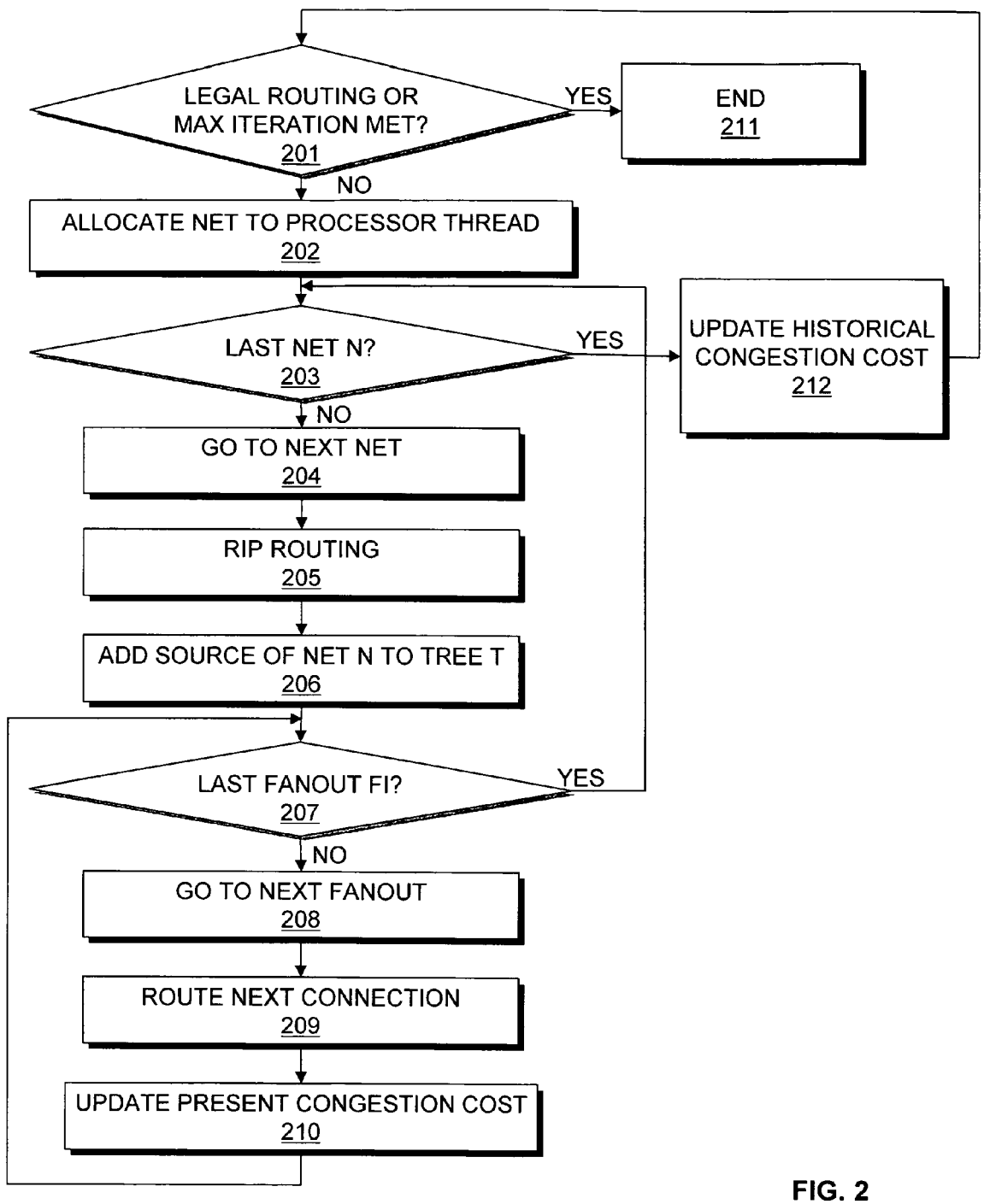
FIG. 2 is a flow chart illustrating a method for performing parallel routing according to an exemplary embodiment of the present invention.

FIG. 2 is a flow chart illustrating a method for performing parallel routing according to an exemplary embodiment of the present invention. The method described with reference to FIG. 2 may be used to implement 103 in FIG. 1. At 201, it is determined whether a legal routing of the system has been generated or whether a maximum number of iterations of the routing procedure has been performed. If a legal routing of the system has been generated or a maximum number of iterations of the routing procedure has been performed, control proceeds to 211. If legal routing of the system has not been generated or a maximum number of iterations of the routing procedure has not been performed, control proceeds to 202.

At 202, the nets to be routed are allocated to available threads. According to an embodiment of the present invention, the nets are allocated based upon their positions on a target device and/or based upon their positions relative to each other. In one embodiment, the nets may be allocated using a static scheduling approach where the target device is partitioned into one or more partitions and nets corresponding to each partition are allocated to a designated thread. During some of the routing procedure, the designated threads may be executed in parallel. In an alternate embodiment, the nets may be allocated using a dynamic scheduling approach where the nets are allocated based upon their dependency on one other. In this approach, nets having the potential to utilize the same routing resources are determined to be dependent on one another. A set of dependent nets (nets that are linked together by dependencies) are allocated to the same thread. During the routing procedure, a plurality of threads scheduled to route sets of nets, where each set of nets is independent, may be executed in parallel. After the nets to be routed are allocated to available threads, each of the threads performs the following procedures described below.

At 203, it is determined whether the last net N has been routed. If it is determined that the last net N has been routed, control returns to 201 and a current iteration count is incremented. If it is determined that the last net N has not been routed, control proceeds to 204.

At 204, the next net N with fanouts Fi is analyzed.

At 205, any previous routing for fanout Fi is discarded ("ripped-up") and removed from a routing tree T which describes physical resources on the target device to route the system.

At 206, a source of net N is added to the routing tree T.

At 207, it is determined whether the last fanout Fi from net N has been routed. If the last fanout Fi from net N has been routed, control returns to 203. If the last fanout Fi from net N has not been routed, control proceeds to 208.

At 208, the next fanout Fi is analyzed.

At 209, the connection to fanout Fi is routed. According to an embodiment of the present invention, the connection may be routed by adding the routing tree T to a heap. The heap is a sorting structure the may be used to perform a search of a routing resource graph that includes a list of all available routing resources that may be used to route the connection. It should be appreciated that other types of sorting structures may be used. After a new set of routing resources for routing the connection C is added to the routing tree, the heap may be emptied. It should be appreciated that other techniques and procedures may be utilized to route the connection.

At 210, present congestion costs for the resources on the target device are updated. The congestion cost reflects a cost for using a particular routing resource. A routing resource that has not been designated to be used for routing may have a relatively low congestion cost, whereas a routing resource which is designated to be used for routing may have a relatively high congestion costs. It should be appreciated that updating the congestion cost may be performed after the routing of each connection, after routing of all the connections in a net, after routing of all of the net, or at other times. Control returns to 207.

After all nets have been routed, the historical congestion cost of each routing resource is updated. The historical congestion cost of a routing resource is increased if it is currently congested. Before the routing procedure begins (that is before control has ever reached 201), the historical congestion of each routing resource is initialized to a low value, such as 0 or 1. By increasing the historical congestion cost for each routing resource at the end of every routing iteration in which it is congested, a "history" of congestion is built up that helps to guide the router to avoid routing resources that have tended to be overused. It should be appreciated that alternative routing approaches may not include a historical congestion cost, or may compute it using different functions, such as a by weighting the congestion in more recent iterations more highly than congestion in earlier iterations.

At 211, control terminates the procedure.

While FIG. 2 shows each net being re-routed until a legal routing is achieved, it should be appreciated that alternative rip-up strategies may be employed. For example, only nets that are currently illegally routed (that is, use congested routing resources) may be re-routed. This is achieved by changing step 204 to go to the next congested net instead of simply the next net. Embodiments of the present invention can be applied to such a router by identifying all nets involved in congestion and creating a schedule for parallel routing of those nets according to the techniques described herein.

According to an embodiment of the present invention, a method for performing parallel routing may also be performed using the pseudo code listed below.

```
Data structure allocation & initialization
Current_Iteration = 1
While (Routing Not Legal && Current_Iteration <=
Max_Router_Iterations) {
    Perform pre-iteration operations
    Allocate all nets to available threads
    For every net N with fanouts F_i {
        Rip-up routing for all F_i and remove from routing tree T
        Add source of net N to routing tree T
        For every connection C in F_i {
            Add T to heap
            Using heap perform search in rr-graph to route C
            Add new routing for C to T
            Empty heap
        }
        Update present congestion costs for all rr-nodes used by net N
    }
    Perform post-iteration operations
    Update historical congestion costs for all rr-nodes
    Current_Iteration++
}
Data structure clean-up
```

FIG. 2 illustrates a routing procedure that allocates nets to threads that may route nets in parallel using a negotiated congestion technique. It should be appreciated that the routing procedure may use techniques other than the negotiated congestion technique illustrated.

Figure 3:
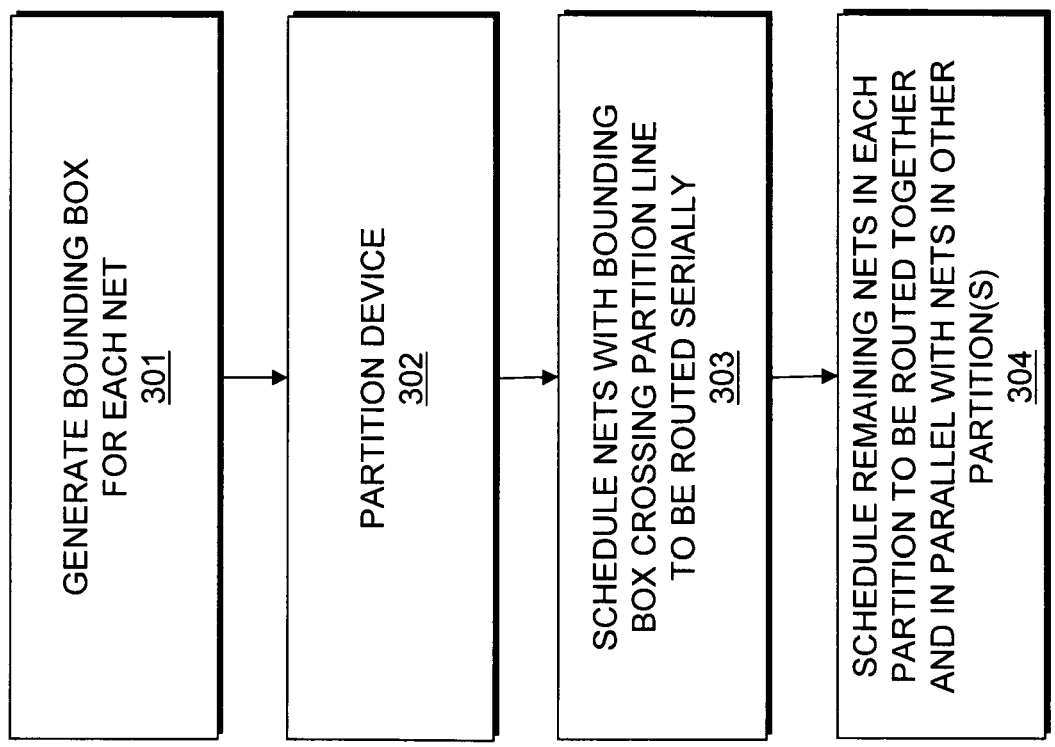
FIG. 3 is a flow chart illustrating a method for scheduling nets statically according to an exemplary embodiment of the present invention.

FIG. 3 is a flow chart illustrating a method for scheduling nets statically according to an exemplary embodiment of the present invention. The method described with reference to FIG. 3 may be used to implement 202 illustrated in FIG. 2 or may be used with other routing procedures. At 301 a bounding box is generated for each net to be routed. According to an embodiment of the present invention, the bounding box defines an area on a target device and routing resource graph and is constructed around all terminals of a net. The purpose of the bounding box is to limit the scope of the routing resource graph search in a routing procedure. A routing procedure is not allowed to explore or utilize routing resources outside a net's bounding box. According to an embodiment of the present invention, for a routing resource to be in a bounding box, the entire routing resource must be in the bounding box. Alternatively, in order for a routing resource to be in a bonding box, the drive point for the routing resource must be in the bounding box. The bonding box for a net may be constructed such that it is the smallest box that encapsulates all the terminals of the net. Alternatively the box can be made larger than the minimum sized feasible box. The bounding box can also be constructed separately for each terminal in a net, where the box is sized to encapsulate a particular destination and the source terminal of a net. According to an embodiment of the present invention, a bounding box may be square or rectangular in shape. It should be appreciated, however, that the bounding box may also be constructed to include any number of sides having any appropriate length.

At 302, the target device is partitioned. According to an embodiment of the present invention, the target device is partitioned into a number equal to the number of threads available to be utilized in routing the nets. One or more partition lines may be used to equally partition the target devices into areas of equal sizes. Alternatively, the one or more partition lines may be used to partition the target device so to maximize the number of nets that do not cross a partition line while balancing the number of nets among the partitions. The partition lines may be vertical, horizontal, or even jagged lines.

At 303, nets with bounding boxes crossing a partition line are scheduled. According to an embodiment of the present invention, nets with bounding boxes that cross a partition line are assigned to one of the threads to be routed serially.

At 304, the remaining nets in each partition are scheduled to be routed together and in parallel with nets of other partition(s). For example, nets remaining in a first partition may be scheduled to be routed by a first thread and nets remaining in a second partition may be scheduled to be routed by a second thread.

Figure 4:
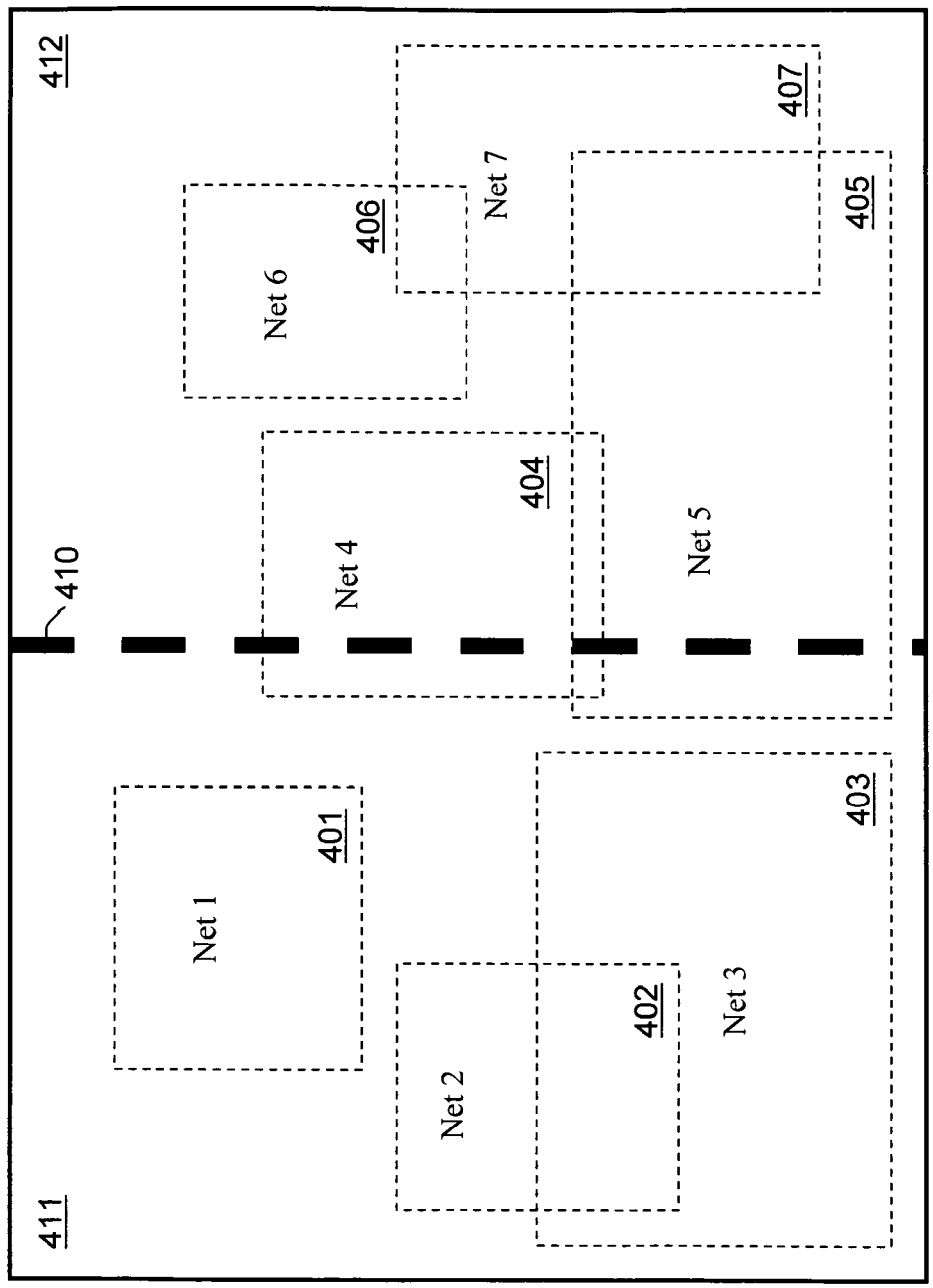
FIG. 4 illustrates a target device partitioned according to an exemplary embodiment of the present invention.

FIG. 4 illustrates a target device 400 partitioned according to an exemplary embodiment of the present invention. In this example, there are 7 nets to be routed on target device 400. Bounding boxes are generated for each of the nets. Bounding boxes 401-407 are generated for nets 1-7. For a system having two processors that support two threads, the target device 400 may be partitioned into two partitions. The target device 400 is a chip that includes routing resources and can be depicted as a routing resource graph. The target device 400 is partitioned with a single partition line 410 into a first partition 411 and a second partition 412.

At the start of an iteration of a routing procedure, the nets with bounding boxes that cross the partition line 410 are routed by a first thread. In this example, net 4 with bounding box 404 and net 5 with bounding box 405 are routed by the first thread serially. Once the first thread has completed routing net 4 and net 5, a scheduler assigns the nets with bounding boxes on the left partition, partition 411, to be routed by the first thread. The scheduler assigns the nets with bounding boxes on the right partition, partition 412, to be routed by the second thread. At this point, the first and second threads run in parallel. Each thread updates all the present congestion cost terms as nets are routed. Once all the threads have completed execution, the historical congestion costs may be updated and a next iteration may begin. The method used to schedule as illustrated in FIG. 4 is referred to as a method for static scheduling.

Figure 5:
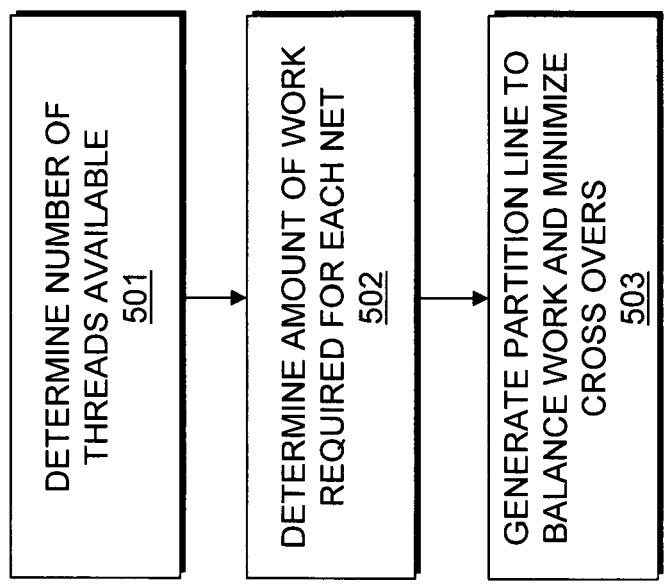
FIG. 5 is a flow chart illustrating a method for partitioning a target device according to an embodiment of the present invention.

FIG. 5 is a flow chart illustrating a method for partitioning a target device according to an embodiment of the present invention. The method described with reference to FIG. 5 may be used to implement 302 illustrated in FIG. 3. The method described with referenced to FIG. 5 is an alternative to the one illustrated in FIG. 4 and may be referred to as a method for advanced static scheduling. At 501, a number of threads available to route nets is determined. According to an embodiment of the present invention, the number of threads available may correspond directly to the number of processors or processor cores are available on a system executing a system design software or to a number of threads available to route the nets.

At 502, an amount of work required for routing each net is determined. According to an embodiment of the present invention, an approximation for the amount of work for routing a net may be computed by counting a number of fanouts (connections) in each net. An amount of time required to route a net may be assumed to be proportional to a number of fanouts in the net.

At 503, one or more partition lines are generated to partition the nets to be routed so to balance the amount of work required in each of the partitions and to minimize the number of bounding boxes that cross partition lines.

Figure 6:
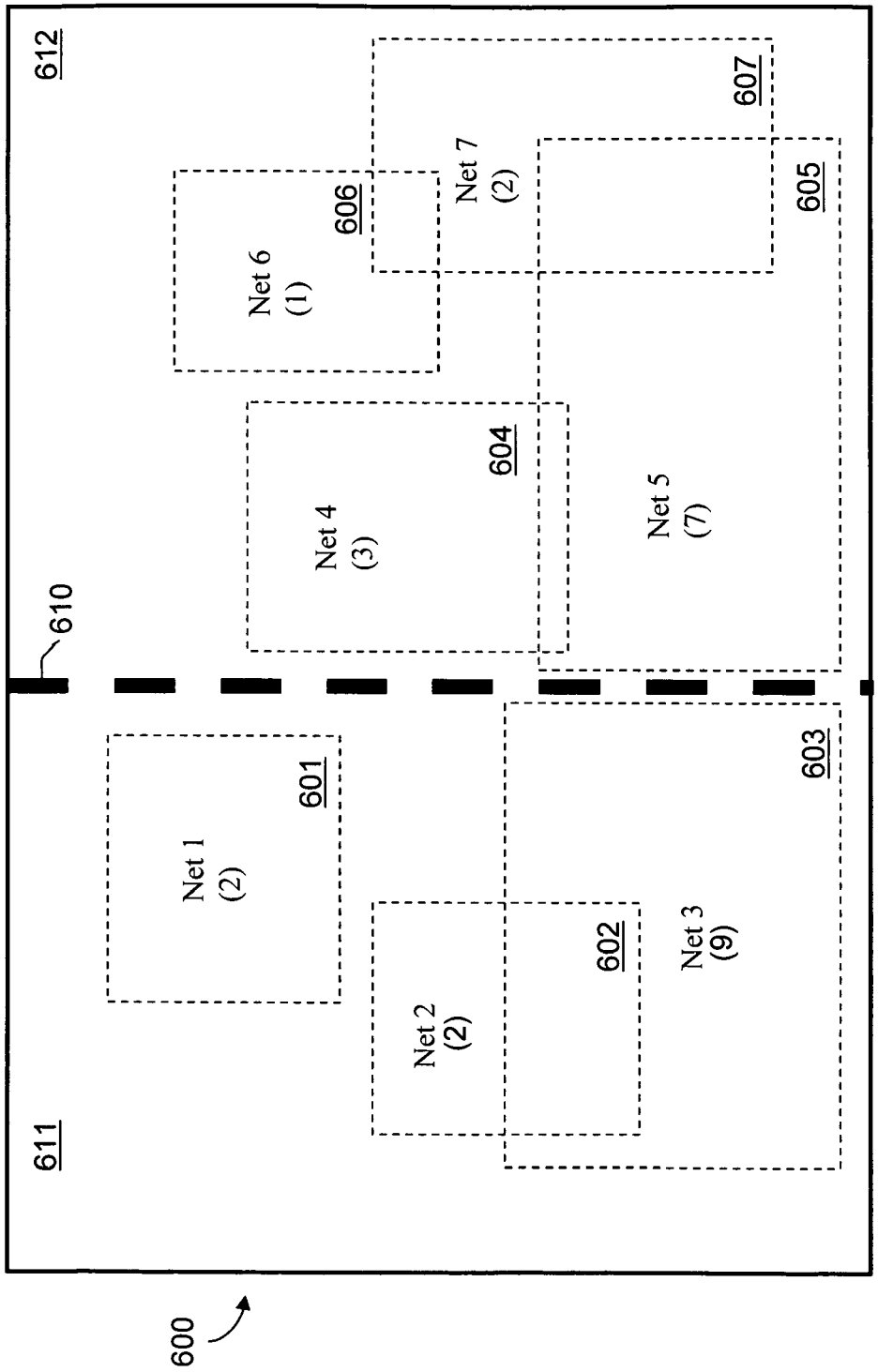
FIG. 6 illustrates a target device partitioned according to the method illustrated in FIG. 5.

FIG. 6 illustrates a target device 600 partitioned according to the method illustrated in FIG. 5. The target device 600 is similar to target device 400 illustrated in FIG. 4 in that it includes 7 nets, nets 1-7, to be routed which each have bounding boxes 601-607. The nets 1-7 and bounding boxes 601-607 in FIG. 6 are positioned identically to the nets 1-7 and bounding boxes 401-407 illustrated in FIG. 4. The fanout for each net is shown in ( ) beside the net numbers. Net 1 is shown to include 2 fanouts. Net 2 is shown to include 2 fanouts. Net 3 is shown to include 9 fanouts. Net 4 is shown to include 3 fanouts. Net 5 is shown to include 7 fanouts. Net 6 is shown to include 1 fanout. Net 7 is shown to include 2 fanouts.

The partition line 610 generated for target device 600 1) balances the amount of routing work in each chip partition, and 2) minimizes the number of nets with bounding boxes that cross the partition line 610. By generating partition line 610 left of the center of the target device 600, an equal number of net connections are captured on each partition and better balances the work load for thread performing routing. Since no bounding boxes cross the partition line 610, none of the nets are scheduled to be routed serially. The scheduler can assign the nets with bounding boxes on the left partition, partition 611, to be routed by the first thread. The scheduler assigns the nets with bounding boxes on the right partition, partition 612, to be routed by the second thread. The first and second threads run in parallel. Each thread updates all the present congestion cost terms as nets are routed. Once all the threads have completed execution, the historical congestion costs may be updated and a next iteration may begin.

Once nets confined to an initial set of partitions have all been routed, a new set of partition lines can be created in order to divide the remaining (not yet routed) nets into multiple groups of nets. Each group consists of nets whose bounding boxes are completely contained with one of these new partitions. Nets in different groups can therefore be routed in parallel, since their routings will not interact. Each group is assigned to a different thread to enable this next phase of parallel routing. This procedure of creating new partition lines to determine new sets of independent nets that can be routed in parallel can be repeated multiple times. When the remaining nets span much of the chip, or there is insufficient independence between the remaining nets for other reasons, the remaining nets are routed serially by a single thread.

When performing multiple partitionings of the chip in this way, extra care must be taken to keep the routing algorithm deterministic and sequentially equivalent. A deterministic algorithm always produces the same result given the same input, and a sequentially equivalent algorithm always produces the same result, regardless of the number of processors or threads used to compute results in parallel. The routing algorithm maintains determinism and sequential equivalence by always using the same number and location of partition lines, regardless of the number of processors available. This is sufficient to ensure that nets with dependencies are always routed in the same order, and neither the number of processors nor the precise execution time of different threads impacts the order in which dependent nets are routed. So long as the algorithm routes dependent nets in a fixed order, it will make the same routing decisions, maintaining determinism and sequential equivalence.

Figure 7:
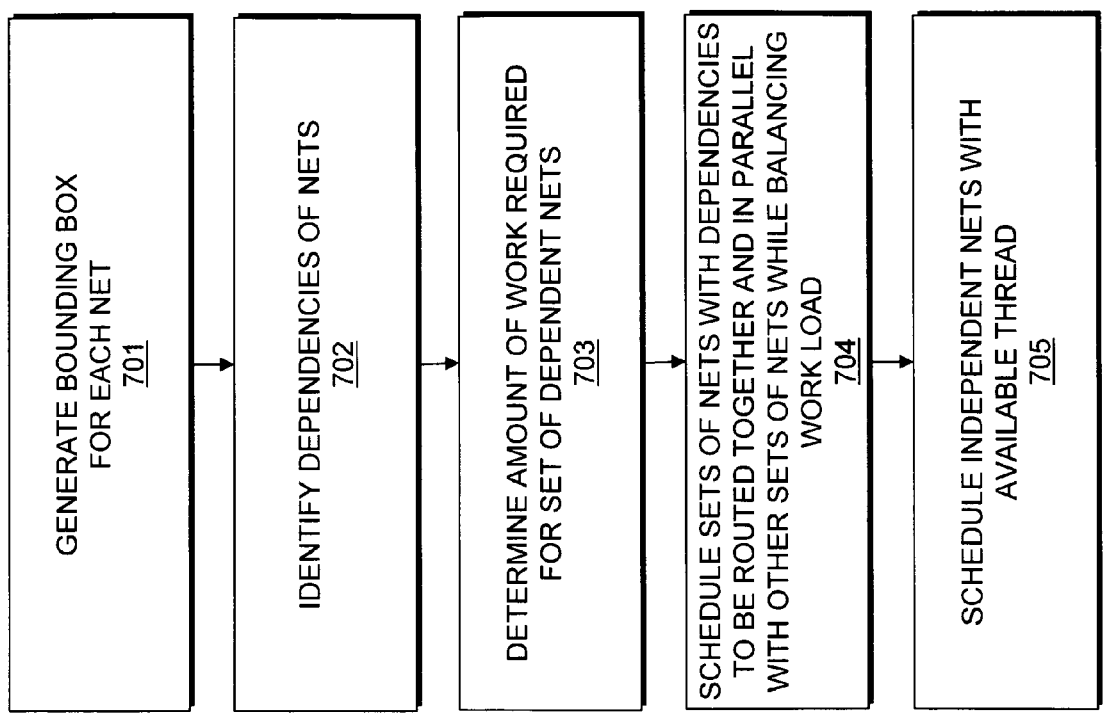
FIG. 7 is a flow chart illustrating a method for scheduling nets dynamically according to an embodiment of the present invention.

FIG. 7 is a flow chart illustrating a method for scheduling nets dynamically according to an embodiment of the present invention. The method described with reference to FIG. 7 may be used to implement 202 illustrated in FIG. 2 or may be used with other routing procedures. At 701 a bounding box is generated for each net to be routed. The bounding box may have the characteristics of the bounding box described with reference to FIG. 3.

At 702, nets having dependencies are identified. According to an embodiment of the present invention, a first net is determined to be dependent on a second net if the nets have bounding boxes that intersect. A first net may also be determined to be dependent on a second net if both the first and second net have bounding boxes that intersect a bounding box of a third net.

At 703, an amount of work required for routing each net is determined. According to an embodiment of the present invention, an approximation for the amount of work for routing a net may be computed by counting a number of fanouts in each net. An amount of time required to route a net may be assumed to be proportional to a number of fanouts in the net.

At 704, sets of nets with dependencies on each other are scheduled to be routed together. According to an embodiment of the present invention, one or more sets of nets with dependencies on each other are scheduled to be routed together by a common thread and in parallel with another one or more sets of nets scheduled to be routed by another available common thread while balancing work load among the threads. Work load may be balanced, for example, by computing the amount of work required for a set of dependent nets from the work required for each individual net in the set and comparing the work required for sets of dependent nets to be routed by available threads.

At 705, nets having no dependencies (independent nets) are scheduled to be routed by available threads. According to an embodiment of the present invention, independent nets are scheduled to be routed after the one or more sets of nets with dependencies are routed. By routing the independent nets last, idle time in the threads are reduced.

Figure 8A:
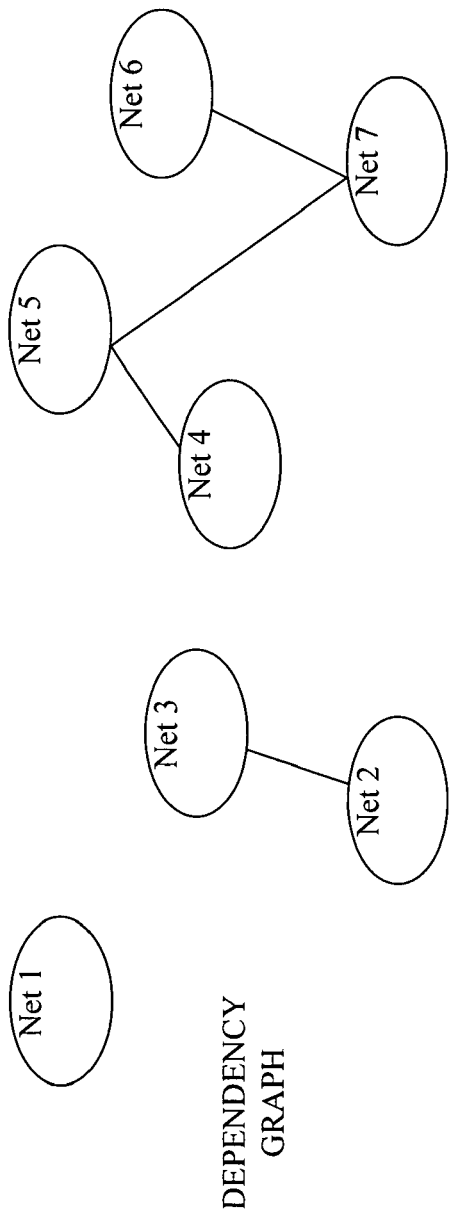
FIGS. 8a and 8b illustrate an example of a dependency graph and dynamic scheduling according to an embodiment of the present invention.
Figure 8B:
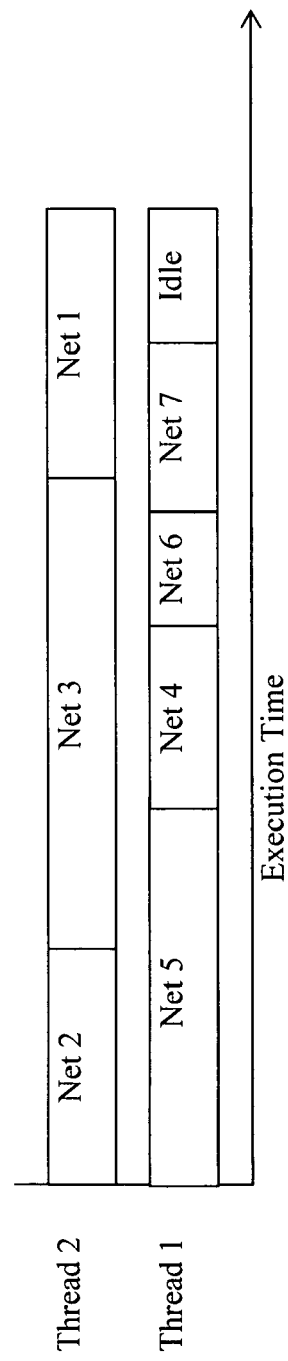

FIGS. 8a and 8b illustrate an example of a dependency graph and dynamic scheduling according to an embodiment of the present invention. FIG. 8a is a dependency graph that illustrates the relationship between nets 1-7 which were previously described with reference to FIGS. 4 and 6. As shown, in FIGS. 4 and 6, net 1 has a bounding box that does not intersect with other bounding boxes and is an independent net. Nets 2 and 3 have bounding boxes that intersect and are dependent on each other. Nets 4 and 5 have bounding boxes that intersect each other. Nets 5 and 7 have bounding boxes that intersect each other. Nets 7 and 6 have bounding boxes that intersect each other. The dynamic scheduler must ensure that nets that are dependent on each other are not routed in parallel.

The various sets of nets being simultaneously routed on multiple threads must have no dependencies between the sets. This is enforced by ensuring that there are no dependency edges that cross the sets, or equivalently by ensuring the bounding boxes of the nets in one set do not overlap with the bounding boxes of the nets in another set. Once these first sets of nets have been routed, the remaining nets are examined and new sets of nets with no dependencies between the sets are computed. In this computation, all nets that have already been routed are removed from the dependency graph, since their dependencies are no longer relevant. This increases the amount of independence amongst the remaining nets. Several of these new sets of nets are sent to threads to execute in parallel. This procedure continues until no more nets remain to be routed.

Instead of waiting for sets of nets to be routed, and then producing a new set of independent nets for parallel routing, the algorithm can precompute all the sets of independent nets to be routed, where some sets must not begin routing until earlier sets are complete. This restriction can be encoded via a dependency edge between the sets, ensuring the scheduler will not attempt to route them simultaneously. Pre-computing all sets of independent nets in this way has the advantage that it guarantees the routing algorithm is deterministic. It has the disadvantage that the schedule must be computed using estimates of how long it will take to route each net, which may result in less efficient load balancing amongst threads than an approach that can adapt the schedule as nets complete routing.

FIG. 8b illustrates the dynamic scheduling of the nets according to an exemplary embodiment of the present invention. As shown, one possible scheduling solution would be to schedule the routing of nets 2-3 with thread 1 while scheduling the routing of nets 4-7 with thread 2. The routing of net 1 may be scheduled with thread 1 after thread 1 completes routing of nets 2-3.

According to an embodiment of the present invention where multiple sets of nets are scheduled to be routed by a thread, the sets of nets with the most dependencies or that require the most work may be routed before sets of nets with fewer dependencies or that require less work. Likewise, when scheduling a plurality of nets, nets with more connections, fanouts, or requiring more work may be scheduled ahead of nets with fewer connections, fanouts, or requiring less work.

The method of dynamic scheduling described with reference to FIG. 7 discards the notion of a fixed chip division. Instead a scheduler using this method may implement a dependency graph similar to those used in a compiler. The scheduler assigns nets to threads based on what nets are currently being routed by other threads. It should be appreciated that the nets or sets of nets may be scheduled dynamically as a thread is completing work on routing a current net or set of nets. Alternatively, the scheduling may be performed in advance based on the identification of dependent nets and the amount of work required for the nets. According to an embodiment of the present invention, a system design may initially include both independent and dependent nets. A dependent net may be dependent on an independent net where the dependent net should not be routed (cross cutlines) until the independent net has been routed. Once all of the "first-cut" sets of nets have been routed, the remaining nets may be used to produce a new set of independent nets which can be routed in parallel by using new cutlines or by using the dependency graph.

According to an embodiment of the present invention, multi-threaded routing is based upon using geometric properties of the target device and routing resource graph. In order to limit the scope of the graph search, a bounding box is constructed around all the terminals of a net and the search is never allowed to explore outside this bounding box. If two nets have bounding boxes that do not intersect, then the two nets could be routed in parallel since they will never explore the same positions of the routing resource graph. These two nets could update the cost term associated with the routing resource graph without the overhead of locking access because they would be guaranteed to never have explored or used any of the same routing resources.

Embodiments of the present invention minimize memory overhead since the routing resource graph does not need to be duplicated for each thread. The heap or other sorting structure used to keep a partially sorted list of promising routing resources during each graph search is duplicated for each thread. The amount of inter-process communication required is also minimal since only basic information such as a list of nets to route is transferred between a scheduler and a thread that performs routing. Embodiments of the present invention also require minimal locking access to data structures since each thread works on routing different portions of the routing resource graph and related data structures. To be more specific, no locking access is required when routing a single net or set of independent nets. When a thread completes the routing of the set of nets assigned to it, locking or some other synchronization method will generally be required to interact with the net routing scheduler in order to obtain the next set of nets to be routed.

According to an embodiment of the present invention, the placement performed at 102 in FIG. 1, may be performed to select locations of net terminals that would create more independent net bounding boxes. By reducing dependencies between bounding boxes the amount of routing parallelism can be increased.

According to an embodiment of the present invention, when a legal routing solution has not been found after repeated attempts, the bounding boxes for one or more nets may be changed by increasing its size to allow for routing congestion to be resolved. When the size or location of a bounding box is changed, scheduling of the routing of the nets would be updated to account for cross over and/or dependencies.

Embodiments of the present invention have been described with reference to routing nets in parallel. It should be appreciated that some connections in a net may be scheduled to be routed in parallel with other connections in the same net or with the connections of another net. This approach may be utilized when a system design includes high-fanout nets that span a large area of a target device and produces large bounding boxes. These nets would be difficult to route in parallel with other nets because of potential overlap and would limit the speed-up of multi-threaded routing. Instead of routing all the connections for a net at one time, it is possible to route each connection for a net individually. The bounding box described may be sized for each particular connection. By breaking nets up and routing connections independently, other nets or other connections for other nets can be routed in parallel. An intermediate approach can also be taken where a net may be broken into two or more sets of connections. The sets of connections can be routed in parallel and only the initial set up of a partial routing into the bounding box containing each set of connections need be performed serially.

An example embodiment of such a connection-parallel router would divide the region covered by a net into two or more partitions. The net source would lie in one partition. The algorithm routes from the net source to one or more terminals of the net, until some portion of the partial routing is contained within each partition. This first procedure is executed serially. From that point onward, routing of the remaining net connections can proceed in parallel. Each thread is passed a partition and the partial routing contained within that partition. Each thread routes to all the terminals of the net within its partition, with the routing of the first such terminal starting on the partial routing passed to the thread. As connections are routed, they are added to the partial routing, and the routing of each connection is not allowed to go outside a bounding box that was passed to the thread. When all the connections allocated to a thread have been routed, the thread synchronizes with other threads to merge the routing of its connections with those of other threads that have been routing connections for that net, creating a complete routing for the net.

Figure 12:
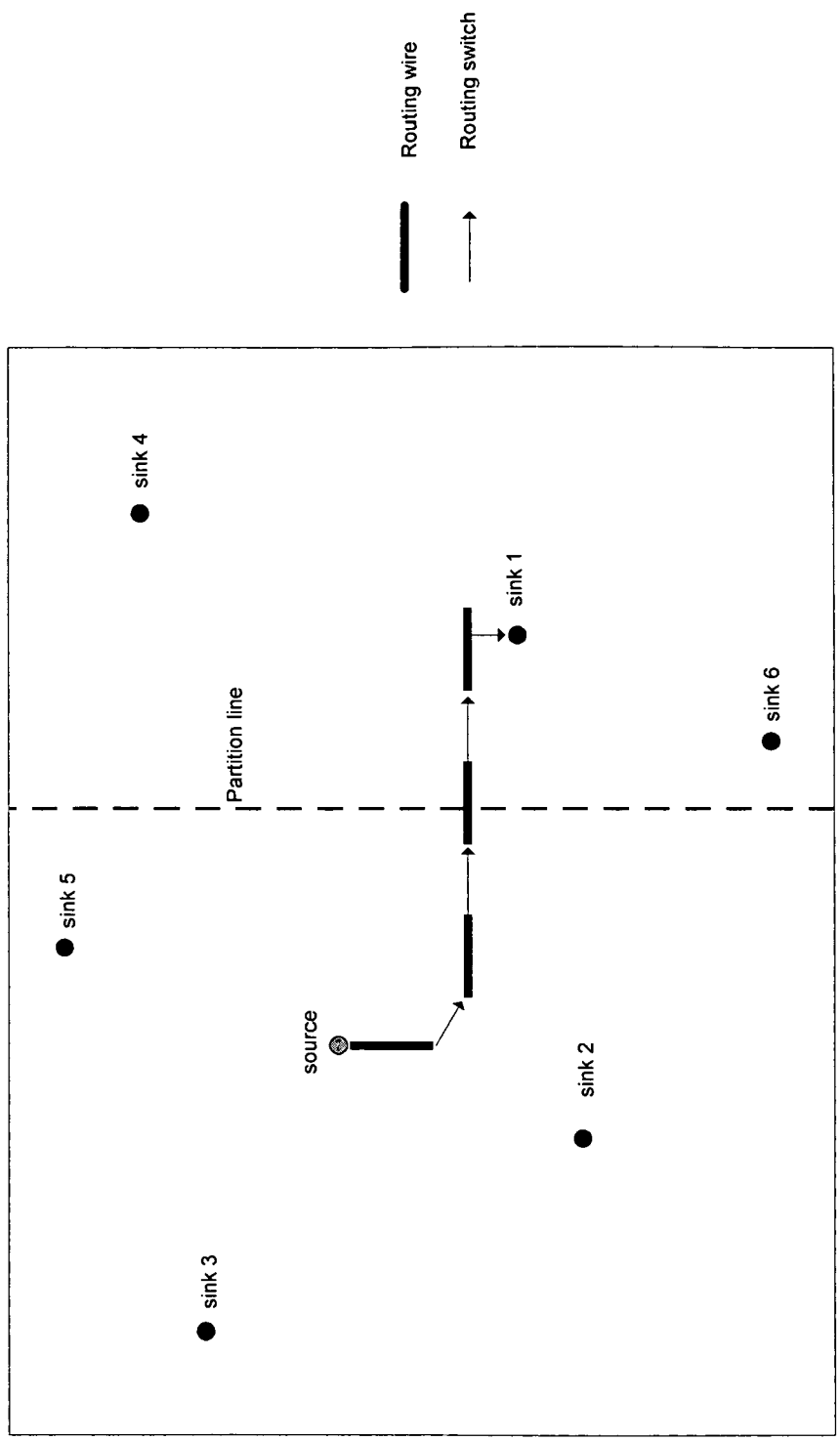
FIG. 12 illustrates a partially routed net according to an exemplary embodiment of the present invention.
Figure 13:
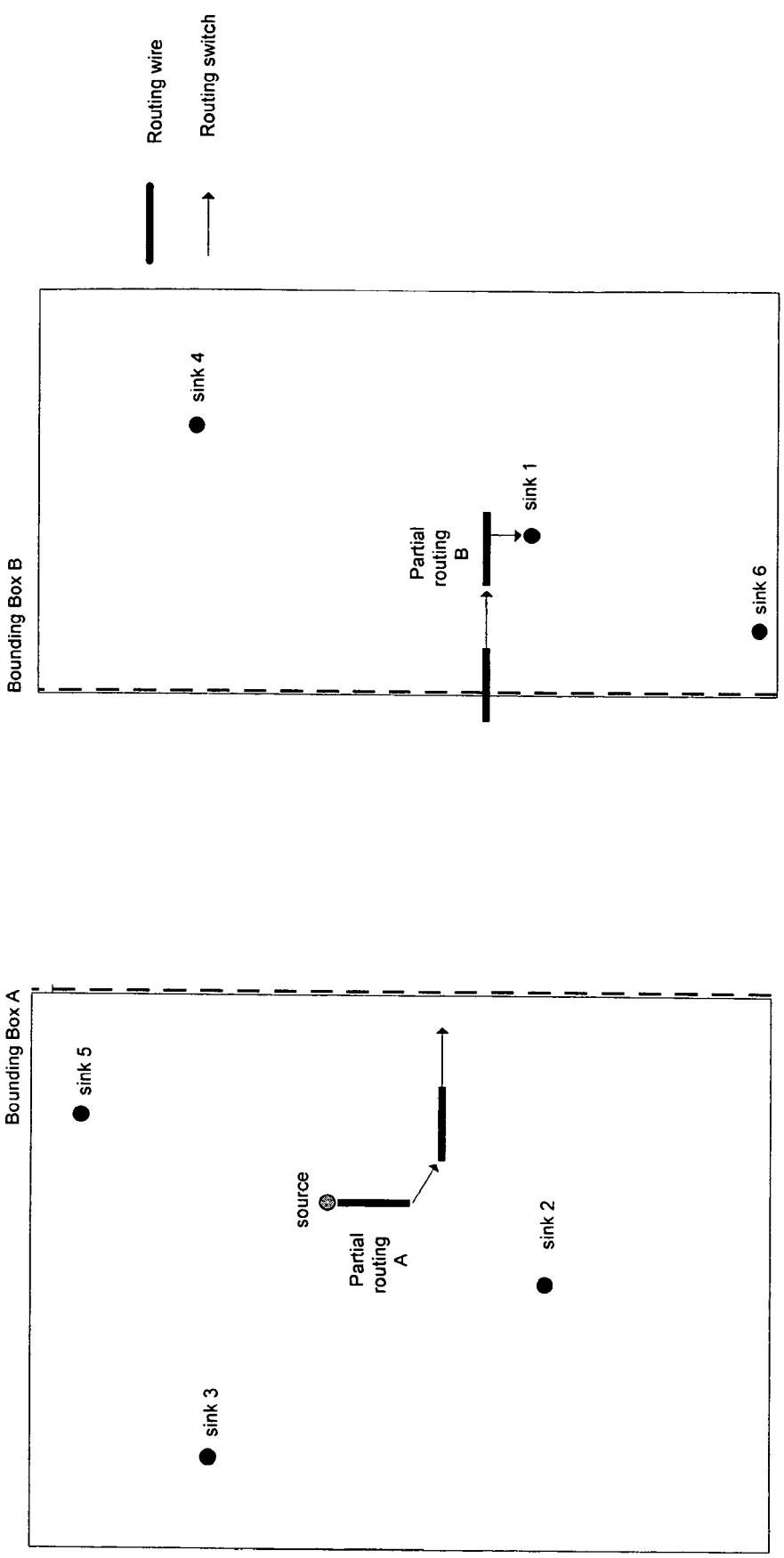
FIG. 13 illustrates the bounding boxes generated for the net for connection-parallel routing.

FIG. 12 illustrates a partially routed net according to an exemplary embodiment of the present invention. The net is a 7 terminal net having a source and sinks 1-6. FIG. 13 illustrates the bounding boxes, bounding box A and bounding box B, generated for the net for connection-parallel routing. Sinks 2, 3, and 5 are routed starting from partial routing A with the routing confined to bounding box B. Sinks 4 and 6 are routed starting from partial routing B with the routing confined to bounding box B. Routing of sinks 2, 3, and 5 can be performed in parallel with the routing of sinks 4 and 6.

According to an embodiment of the present invention, timing analysis may be run during routing and/or at the end of routing using real routing wire delays for each connection. Performing timing analysis during routing allows the routing procedure to make improvements to critical paths. The timing analysis could be run in a separate thread in parallel with the routing procedure. The timing analysis thread would communicate updated information about the critical path of the design to the thread performing routing. When routing converges to a solution, timing may be improved by performing timing analysis on final net delays and then ripping up and re-routing the most critical connections. The timing for the new converged solution may be analyzed and either the new or old route is selected based upon the timing. Many convergences may be analyzed and the best solution saved. Runtime may be saved by analyzing convergences in parallel using multiple processors.

According to an embodiment of the present invention, global updates may be made to the routing resource graph and other large data structures. At the start and end of every routing iteration, traversals of large data structures such as the routing resource graph are required in order to update cost information. These updates could be done by multiple threads in parallel by having each thread work on a separate portion of the data structure.

According to an embodiment of the present invention, both static and dynamic scheduling may be enhanced to improve cache efficiency by routing nets that are geometrically close to each other on the same thread one after the other. For example, one could route all nets that start in a certain (x,y) location one after the other on a certain thread so that data used by those nets is likely to be in a cache memory. To make best use of the cache, the routing nodes that are the same (x,y) location should be stored at adjacent memory addresses and nods nearby (x,y) locations should be at nearby memory addresses. The routing resource graph data structure may be organized to enable this. Increased cache locality speeds up the routing procedure even when it is not run in parallel. Since one of the limits of parallel speedup for routing is memory bandwidth and cache capacity, improving the cache locality of each thread also improves the parallel speedup.

Figure 9:
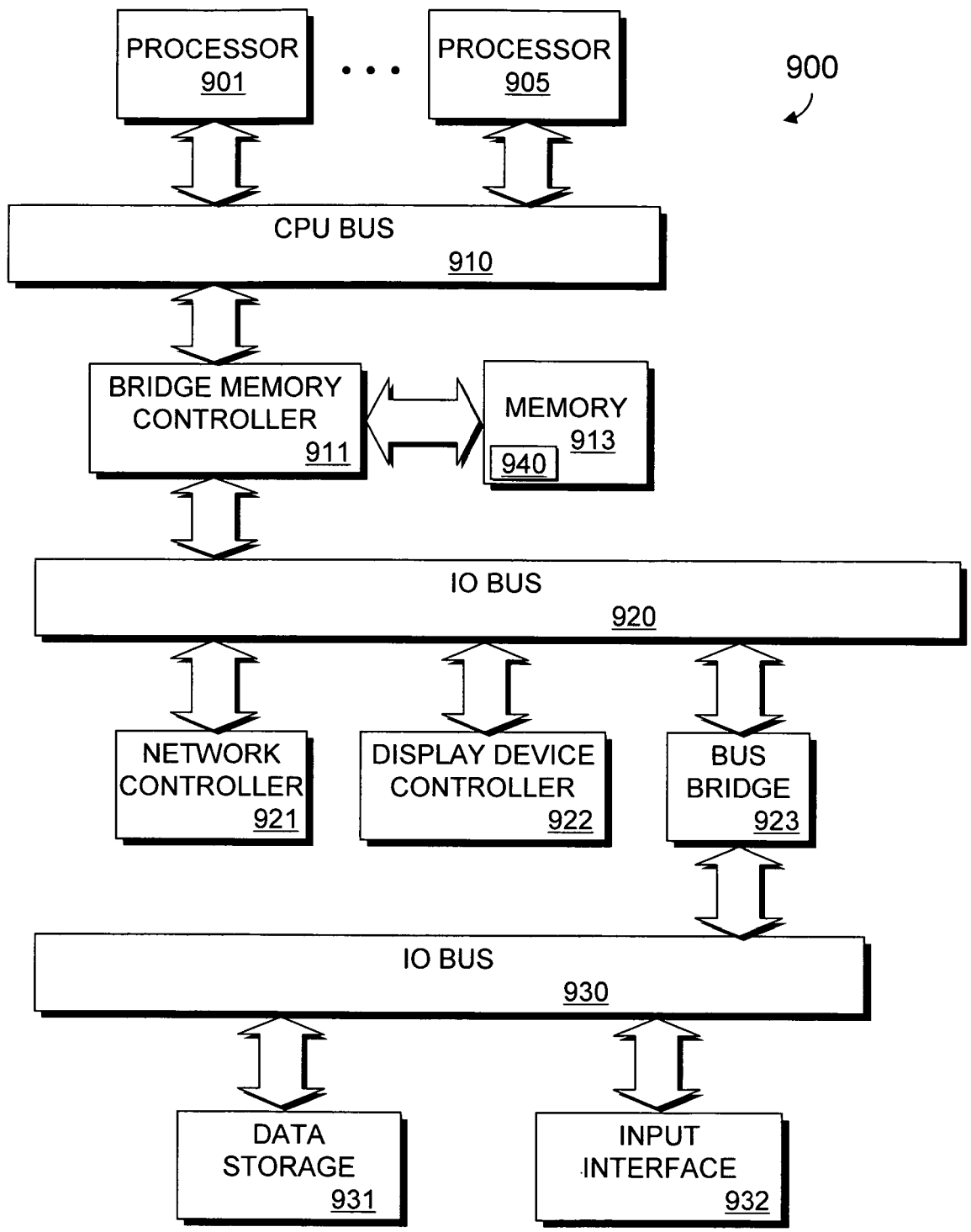
FIG. 9 illustrates a computer system for implementing a system designer according to an example embodiment of the present invention.

FIG. 9 is a block diagram of an exemplary computer system 900 in which an example embodiment of the present invention resides. The computer system 900 includes one or more processors that process data signals. As shown, the computer system 900 includes a first processor 901 and an nth processor 905, where n may be any number. The processors 901 and 905 may be multi-core processors with multiple processor cores on each chip. The processors 901 and 905 are coupled to a CPU bus 910 or other switch fabric that transmits data signals between processors 901 and 905 and other components in the computer system 900. According to an embodiment of the present invention, each of the processors or processor cores in the computer system 900 may execute its own thread. Each thread may run a different part of one or more or the same software program in parallel with other threads.

The computer system 900 includes a memory 913. The memory 913 may store instructions and code represented by data signals that may be executed by the processor 901. A bridge memory controller 911 is coupled to the CPU bus 910 and the memory 913. The bridge memory controller 911 directs data signals between the processors 901 and 905, the memory 913, and other components in the computer system 900 and bridges the data signals between the CPU bus 910, the memory 913, and a first IO bus 920. According to an embodiment of the present invention, the processors 901 and 905 may be directly coupled to the memory 913 and communicates with the memory 913 without a bridge memory controller 911.

The first IO bus 920 may be a single bus or a combination of multiple buses. The first IO bus 920 provides communication links between components in the computer system 900. A network controller 921 is coupled to the first IO bus 920. The network controller 921 may link the computer system 900 to a network of computers (not shown) and supports communication among the machines. A display device controller 922 is coupled to the first IO bus 920. The display device controller 922 allows coupling of a display device (not shown) to the computer system 900 and acts as an interface between the display device and the computer system 900.

A second IO bus 930 may be a single bus or a combination of multiple buses. The second IO bus 930 provides communication links between components in the computer system 900. A data storage device 931 is coupled to the second IO bus 930. An input interface 932 is coupled to the second IO bus 930. The input interface 932 allows coupling of an input device to the computer system 900 and transmits data signals from an input device to the computer system 900. A bus bridge 923 couples the first IO bus 920 to the second IO bus 930. The bus bridge 923 operates to buffer and bridge data signals between the first IO bus 920 and the second IO bus 930. It should be appreciated that computer systems having a different architecture may also be used to implement the computer system 900.

A system designer 940 may reside in memory 913 and be executed by one or more of the processors 901 and 905. The system designer 940 may operate to synthesize a system, place the system on a target device, route the system on the system on the target device, and assemble the system. According to an embodiment of the present invention, the system designer 940 is a program that includes parts that may be executed by multiple threads simultaneously (in parallel).

Figure 10:
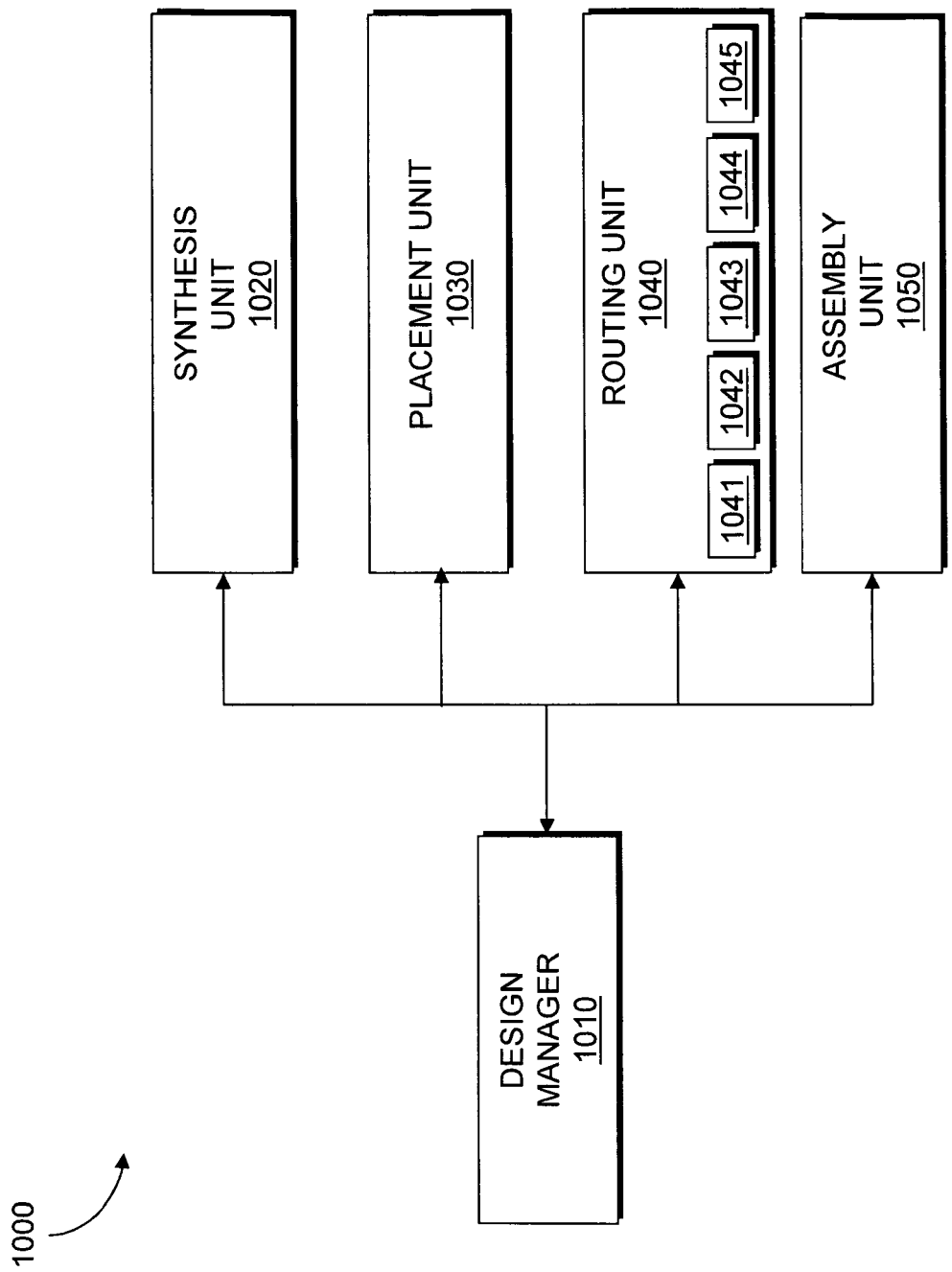
FIG. 10 illustrates a system designer according to an exemplary embodiment of the present invention.

FIG. 10 illustrates a system designer 1000 according to an embodiment of the present invention. The system designer 1000 may be an EDA tool for designing a system on a target device such as an FPGA or other circuitry. FIG. 10 illustrates modules implementing an embodiment of the system designer 1000. According to one embodiment, the modules represent software modules and system design may be performed by a computer system such as the one illustrated in FIG. 9 executing sequences of instructions represented by the modules shown in FIG. 10. Execution of the sequences of instructions causes the computer system to support system design as will be described hereafter. In alternate embodiments, hard-wire circuitry may be used in place of or in combination with software instructions to implement embodiments of present invention. Thus, embodiments of present invention are not limited to any specific combination of hardware circuitry and software. The system designer 1000 includes a designer manager 1010. The designer manager 1010 is connected to and transmits data between the components of the system designer 1000.

The system designer 1000 includes a synthesis unit 1020. The synthesis unit 1020 generates a cell netlist from a design of a system to be implemented on the target device. According to an embodiment of the system designer 1000, the synthesis unit 1020 takes a conceptual HDL design definition and generates an optimized logical representation of the system. The optimized logical representation of the system generated by the synthesis unit 1020 may include a representation that has a minimized number of functional blocks and registers, such as logic gates and logic elements, required for the system. Alternatively, the optimized logical representation of the system generated by the synthesis unit 1020 may include a representation that has a reduced depth of logic and that generates a lower signal propagation delay. The synthesis unit 1020 also determines how to implement the functional blocks and registers in the optimized logic representation utilizing resources such as cells on a target. The technology-mapped netlist illustrates how the resources (cells) on the target device are utilized to implement the system. In an embodiment where the target device is an FPGA or PLD, the technology-mapped netlist may include cells such as look-up tables, Logic Array Blocks (LABs), registers, memory blocks, DSP blocks, IO elements or other components.

The system designer 1000 includes a placement unit 1030 that performs placement. The placement unit 1030 processes the merged cell netlist to produce a placement for each of the cells in the merged cell netlist. The placement unit 1000 places the system on to the target device by determining which components or areas on the target device are to be used for specific functional blocks and registers. According to an embodiment of the system designer 1000, the placement unit 1030 first determines how to implement portions of the optimized logic design in clusters. Clusters may represent a subset of the components on the logic design. A cluster may be represented, for example, by a number of standard cells grouped together. In this embodiment, after portions of the optimized logic design are implemented in clusters, the clusters may be placed by assigning the clusters to specific positions on the target device. The placement unit 1030 may utilize a cost function in order to determine a good assignment of resources on the target device.

The system designer 1000 includes a routing unit 1040 that performs routing. The routing unit 1040 determines the routing resources on the target device to use to provide interconnection between the components implementing the functional blocks and registers of the logic design. The routing unit 1040 includes a bounding box unit 1041 that generates a bounding box for each net to be routed. According to an embodiment of the present invention, a bounding box defines an area on a target device and routing resource graph and is constructed around all terminals of a net. The purpose of the bounding box is to limit the scope of the routing resource graph search in a routing procedure. The bounding box generated by the bounding box unit 1041 is similar to the bounding box described with reference to FIGS. 3 and 7.

The routing unit 1040 includes a work assessment unit 1042. The work assessment unit 1042 estimates an amount of work an amount of work required for routing each net to be routed. According to an embodiment of the present invention, an approximation for the amount of work for routing a net may be computed by counting a number of connections or fanouts in each net. An amount of time required to route a net may be assumed to be proportional to a number of fanouts in the net.

The routing unit 1040 includes a partitioning unit 1043. The partitioning unit 1043 may operate to partition a target device into a number equal to the number of threads available to be utilized in routing the nets. One or more partition lines may be used to equally partition the target devices into areas of equal sizes. Alternatively, the one or more partition lines may be used to partition the target device so to maximize the number of nets that do not cross a partition line while balancing a number of nets or connections among the partitions or an amount of work to be performed for nets among partitions. The partition lines may be vertical, horizontal, or even jagged lines.

The routing unit 1040 includes a dependency identification unit 1044. The dependency identification unit 1044 operates to identify nets having dependencies. According to an embodiment of the present invention, a first net is determined to be dependent on a second net if the nets have bounding boxes that intersect. A group of 3 nets is dependent if the bounding box of net 1 and the bounding box of net 2 each intersect the bounding box of the third net.

The routing unit 1040 includes a scheduler unit 1045. The scheduler unit 1045 may perform a method of static scheduling where the information generated from the partition unit 1043 is used to schedule a plurality of nets to be executed by a plurality of threads simultaneously. In this embodiment, the scheduler unit 1045 first schedules nets with bounding boxes that cross a partition line to be routed by a first thread serially. Next, the scheduler unit 1045 schedules the remaining nets in each partition to be routed together by a designated thread, where the threads are executed in parallel. The scheduler unit 1045 may perform a method of dynamic scheduling where nets with dependencies on each other are scheduled to be routed together. In this embodiment, the scheduler unit 1045 first schedules one or more sets of nets with dependencies on each other to be routed together by a common thread and in parallel with another one or more sets of nets scheduled to be routed by another available common thread while balancing work load among the threads.

The system designer 1000 includes an assembly unit 1050 that performs an assembly procedure that creates a data file that includes the design of the system generated by the system designer 1000. The data file may be a bit stream that may be used to program the target device. The assembly unit 1050 may output the data file so that the data file may be stored or alternatively transmitted to a separate machine used to program the target device. It should be appreciated that the assembly unit 1050 may also output the design of the system in other forms such as on a display device or other medium.

FIG. 10 illustrates an exemplary block diagram of a system designer 1000. It should be appreciated that addition components may be implemented on the system designer 1000, that not all of the components illustrated are necessary to implement the system designer 1000, and that the illustrated components may be substituted with other components.

Figure 11:
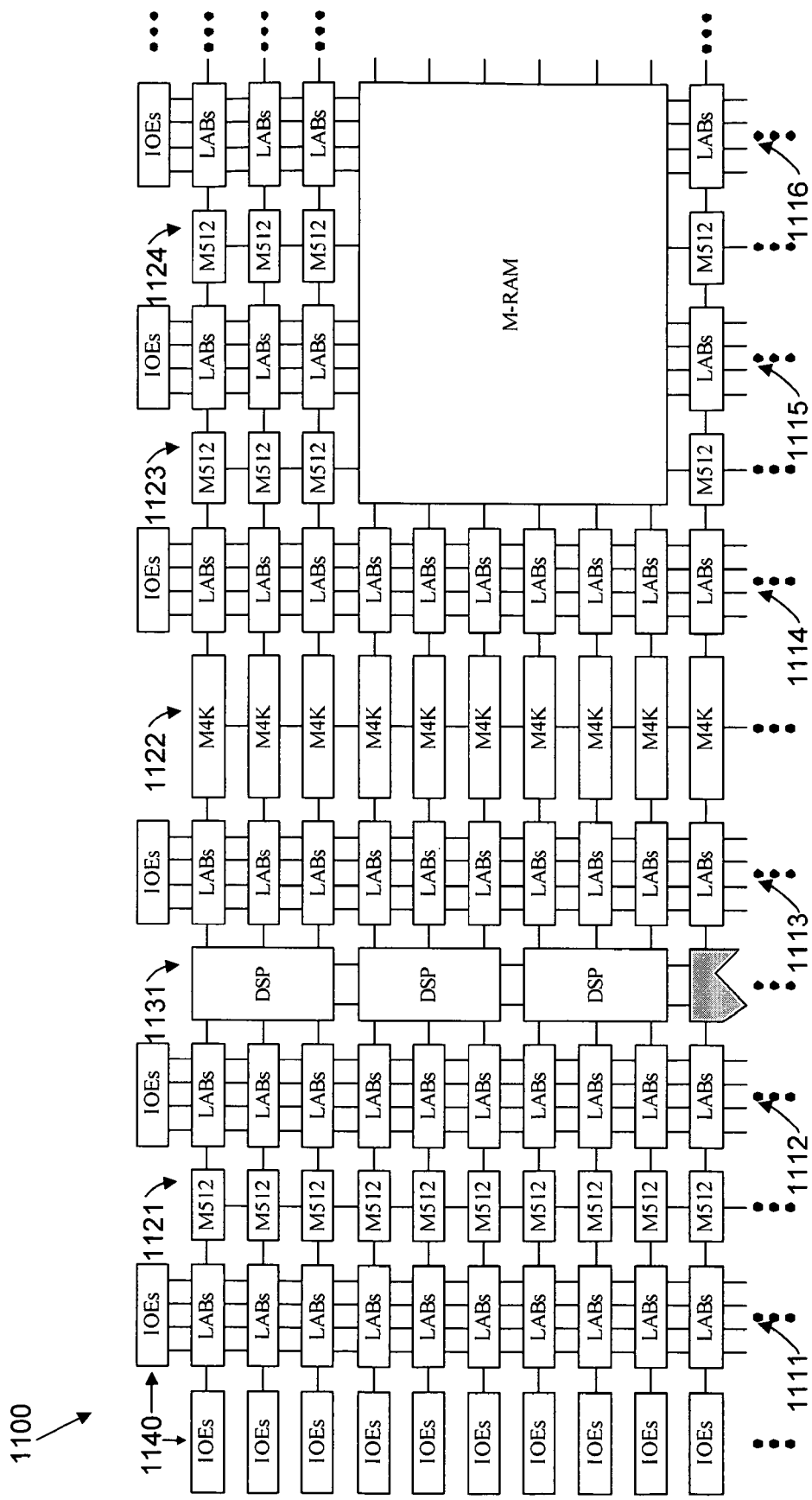
FIG. 11 illustrates an exemplary target device according to an exemplary embodiment of the present invention.

FIG. 11 illustrates an exemplary target device 1100 in which a system may be implemented. In this exemplary embodiment, the target device 1100 is an FPGA. According to one embodiment, the target device 1100 is a chip having a hierarchical structure that may take advantage of wiring locality properties of circuits formed therein.

The target device 1100 includes a plurality of logic-array blocks (LABs). Each LAB may be formed from a plurality of logic blocks, carry chains, LAB control signals, and local routing between the logic blocks, carry chains and LAB control signals. A logic block is a small unit of logic providing efficient implementation of user logic functions. A logic block includes one or more combinational cells, and registers. According to one embodiment of the present invention, the logic block may operate similarly to a logic element (LE), such as those found in Stratix or Cyclone devices manufactured by Altera® Corporation, or a combinational logic block (CLB) such as those found in Virtex devices manufactured by Xilinx Inc. In this embodiment, the logic block may include a four input lookup table (LUT) with a configurable register. According to an alternate embodiment of the present invention, the logic block may operate similarly to an adaptive logic module (ALM), such as those found in Stratix devices manufactured by Altera Corporation. LABs are grouped into rows and columns across the target device 1100. Columns of LABs are shown as 1111-1116. It should be appreciated that the logic block may include additional or alternate components.

The target device 1100 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 300. Columns of memory blocks are shown as 1121-1124.

The target device 1100 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 1100 and are shown as 1131.

The target device 300 includes a plurality of input/output elements (IOEs) 1140. Each IOE feeds an I/O pin (not shown) on the target device 1100. The IOEs are located at the end of LAB rows and columns around the periphery of the target device 1100. Each IOE includes a bidirectional I/O buffer and a plurality of registers for registering input, output, and output-enable signals. The registers in the IOEs enable high-performance interfacing to external devices. Dedicated circuitry may also be included in the IOEs to enable high-speed transfers via external memory interface protocols such as DDR3, source-synchronous protocols, or serial interface protocols such as PCI-express. Alternative embodiments of the target device may arrange the IOEs in columns throughout the device.

The target device 1100 may include routing resources such as LAB local interconnect lines, row interconnect lines ("H-type wires"), and column interconnect lines ("V-type wires") (not shown) to route signals between components on the target device.

FIG. 11 illustrates an exemplary embodiment of a target device. It should be appreciated that a system may include a plurality of target devices, such as that illustrated in FIG. 11, cascaded together. It should also be appreciated that the target device may include programmable logic devices arranged in a manner different than that on the target device 1100. A target device may also include FPGA resources other than those described in reference to the target device 1100.

FIGS. 1-3, 5, and 7 are flow charts illustrating methods according to embodiments of the present invention. The techniques illustrated in these figures may be performed sequentially, in parallel or in an order other than that which is described. The techniques may be also be performed one or more times. It should be appreciated that not all of the techniques described are required to be performed, that additional techniques may be added, and that some of the illustrated techniques may be substituted with other techniques.

Embodiments of the present invention may be provided as a computer program product, or software, that may include an article of manufacture on a machine accessible or machine readable medium having instructions. The instructions on the machine accessible, machine readable, or computer readable medium may be used to program a computer system or other electronic device. The machine accessible, machine readable, or computer readable medium may include, but is not limited to, floppy diskettes, optical disks, CD-ROMs, and magneto-optical disks or other type of media/medium suitable for storing electronic instructions. The techniques described herein are not limited to any particular software configuration. They may find applicability in any computing or processing environment. The terms "machine accessible medium", "machine readable medium", or "computer readable medium" used herein shall include any medium that is capable of storing, or encoding a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, comprising:
   partitioning the target device with a partition line;
   assigning nets having bounding areas that cross the partition line to be routed serially; and
   assigning remaining nets in a first partition to be routed in parallel with remaining nets in a second partition, wherein at least one of the partitioning, the assigning nets, and the assigning remaining nets is performed by a processor.

2. The method of claim 1, wherein the nets to be routed serially are routed before nets to be routed in parallel.

3. The method of claim 1, wherein the partition line partitions the target device into equally sized areas.

4. The method of claim 1, wherein the partition line partitions the target device to balance an amount of routing work for nets in each partition.

5. The method of claim 1, wherein the partition line is created to intersect fewer than a predetermined number of bounding areas.

6. The method of claim 1, wherein the plurality of nets routed in parallel have bounding areas free from overlap.

7. The method of claim 1 further comprising routing nets with overlapping bounding areas serially.

8. The method of claim 1, wherein each bounding area corresponds to an area on the target device.

9. The method of claim 1, wherein each bounding area defines routing resources that can be used for routing its corresponding net.

10. A non-transitory computer readable medium including sequences of instructions stored thereon for causing a computer to execute a method comprising:
   partitioning a target device with a partition line;
   assigning nets having bounding areas that cross the partition line to be routed serially; and
   assigning remaining nets in a first partition to be routed in parallel with remaining nets in a second partition.

11. The non-transitory computer readable medium of claim 10, wherein the nets to be routed serially are routed before nets to be routed in parallel.

12. The non-transitory computer readable medium of claim 10, wherein the partition line partitions the target device into equally sized areas.

13. The non-transitory computer readable medium of claim 10, wherein the partition line partitions the target device to balance an amount of routing work for nets in each partition.

14. The non-transitory computer readable medium of claim 10, wherein the partition line is created to intersect fewer than a predetermined number of bounding areas.

15. The non-transitory computer readable medium of claim 10, wherein the plurality of nets routed in parallel have bounding areas free from overlap.

16. A method for designing a system on a target device, comprising:
   identifying dependencies of nets in the system;
   identifying sets of nets such that nets in each of the sets are free from dependencies from nets from other sets; and
   routing the sets of nets in parallel, wherein at least one of the identifying dependence, the identifying sets of nets, and the routing is performed by a processor.

17. The method of claim 16 further comprising assigning nets with a higher number of dependencies to be routed before nets with fewer or no dependencies.

18. The method of claim 16, wherein identifying dependencies of the nets comprises determining whether a bounding area corresponding to a first net overlaps with a bounding area corresponding to a second net.

19. The method of claim 16, wherein each bounding area corresponds to an area on the target device.

20. The method of claim 16, wherein each bounding area defines routing resources that can be used for routing its corresponding net.

* * * * *